United States Patent
Ajit

(10) Patent No.: US 6,310,385 B1
(45) Date of Patent: Oct. 30, 2001

(54) HIGH BAND GAP LAYER TO ISOLATE WELLS IN HIGH VOLTAGE POWER INTEGRATED CIRCUITS

(75) Inventor: Janardhanan S. Ajit, Sunnyvale, CA (US)

(73) Assignee: International Rectifier Corp., El Segundo, CA (US)

( * ) Notice: Subject to any disclaimer, the term of this patent is extended or adjusted under 35 U.S.C. 154(b) by 0 days.

(21) Appl. No.: 09/007,002

(22) Filed: Jan. 14, 1998

Related U.S. Application Data

(60) Provisional application No. 60/035,641, filed on Jan. 16, 1997.

(51) Int. Cl.⁷ .................................................. H01L 29/12
(52) U.S. Cl. ......................... 257/524; 257/501; 257/506
(58) Field of Search ................................. 257/500, 354, 257/513, 370, 347, 353, 499, 501, 505, 506, 524, 525, 510, 520, 625, 705

(56) References Cited

U.S. PATENT DOCUMENTS

| | | | |
|---|---|---|---|
| 3,290,753 | * 12/1966 | Chang ................................. 29/25.3 |
| 3,838,441 | * 9/1974 | Bean et al. ............................ 357/49 |
| 4,238,762 | * 12/1980 | McWilliams et al. ................ 357/49 |
| 4,242,697 | * 12/1980 | Berthold et al. ..................... 357/49 |
| 4,310,965 | * 1/1982 | Horiuchi et al. ..................... 29/580 |
| 4,755,859 | * 7/1988 | Suda et al. .......................... 357/23.4 |
| 4,918,498 | * 4/1990 | Plus et al. ........................... 357/23.7 |
| 4,920,396 | * 4/1990 | Shinohara et al. .................. 357/42 |
| 4,984,052 | * 1/1991 | Koshino et al. ..................... 357/49 |
| 5,155,571 | * 10/1992 | Wang et al. ......................... 357/42 |
| 5,241,211 | * 8/1993 | Tashiro ................................ 257/506 |
| 5,336,904 | 8/1994 | Kusunoki . |
| 5,362,667 | * 11/1994 | Linn et al. ........................... 437/62 |
| 5,378,923 | 1/1995 | Mitsui et al. . |
| 5,385,855 | * 1/1995 | Brown et al. ........................ 437/41 |
| 5,396,085 | 3/1995 | Baliga . |
| 5,406,096 | * 4/1995 | Malhi .................................. 257/114 |
| 5,408,106 | 4/1995 | Seabaugh . |
| 5,461,253 | * 10/1995 | Tsuruta et al. ...................... 257/501 |
| 5,471,083 | * 11/1995 | Ikeda et al. ......................... 257/370 |
| 5,561,303 | * 10/1996 | Schrantz et al. ..................... 257/77 |
| 5,714,775 | * 2/1998 | Inoue et al. ......................... 257/139 |
| 5,723,896 | * 3/1998 | Yee et al. ............................ 257/499 |
| 5,726,478 | * 3/1998 | Gantioler et al. ................... 257/355 |
| 5,737,671 | * 4/1998 | Watanabe ........................... 399/159 |
| 5,757,081 | * 5/1998 | Chang et al. ....................... 257/778 |
| 5,767,562 | * 6/1998 | Yamashita .......................... 257/500 |
| 5,847,419 | * 12/1998 | Imai et al. .......................... 257/195 |

OTHER PUBLICATIONS

Wolf, Semiconductors, p. 33, 1971.*

* cited by examiner

*Primary Examiner*—Eddie Lee
*Assistant Examiner*—Bradley William Baumeister
(74) *Attorney, Agent, or Firm*—Ostrolenk, Faber, Gerb & Soffen, LLP

(57) ABSTRACT

An integrated circuit is provided in which a relatively low band gap material is used as a semiconductor device layer and in which an underlying high (wide) band gap material is used as an insulating layer. The insulating material has a high thermal conductivity to allow heat dissipation in conjunction with dielectric isolation. The integrated circuit includes one or more semiconductor wells which are each surrounded on their sides by an insulating material. The bottom of the semiconductor wells are disposed atop the high band gap material which provides both electrical isolation and thermal conductivity. A semiconductor substrate may be provided to support the high band gap material. A layer of insulating material may also be provided between the high band gap material and the semiconductor substrate.

16 Claims, 3 Drawing Sheets

40a ≡ High-band-gap semiconductor or Semi-Insulator

40a ≡ High-band-gap semiconductor or Semi-Insulator

HIGH BAND GAP LAYER TO ISOLATE WELLS IN HIGH VOLTAGE POWER INTEGRATED CIRCUITS

RELATED APPLICATIONS

This application claims the priority of Provisional Application Ser. No. 60/035,641, filed Jan. 16, 1997.

BACKGROUND OF THE INVENTION

The present invention relates to junction isolation of high voltage power integrated circuits and, more specifically, relates to improving heat dissipation in high voltage power integrated circuits by using a high (wide) band-gap material as an insulating layer.

Currently, most high voltage integrated circuits are designed and manufactured using junction isolation. Some of the problems that are associated with junction isolation include: (i) difficulty in integrating lateral bipolar devices without parasitic current flow in the substrate material; (ii) likelihood of "latch-up" in CMOS circuits when high dv/dt conditions are present, such as during high voltage switching; and (iii) relatively high leakage current flow in the junction materials at high ambient temperatures.

Dielectric isolation mitigates the above problems. However, the dielectric isolation introduces other problems, such as difficulty in providing heat dissipation through the dielectric isolation material as well as wafer-warpage due to the thick oxides needed to vertically support high-voltage.

Accordingly, a need exists in the electronic semiconductor device art for a structure which provides dielectric isolation that mitigates the problems encountered using junction isolation, which provides adequate heat dissipation of the semiconductor devices irrespective of the dielectric isolation material used and which is not susceptible to wafer-warpage.

SUMMARY OF THE INVENTION

The present invention overcomes the problems associated with the prior art by providing an integrated circuit in which a relatively low band gap material is used as a semiconductor device layer and in which a semi-insulating, underlying high (wide) band gap material is used as a thermally conducting, electrically insulating layer.

The insulating material, which, for example, may be silicon carbide, gallium nitride, semi-insulating polysilicon, amorphous silicon, beryllium oxide or aluminum oxide, is a material of high thermal conductivity to avoid the problem of heat dissipation while attaining the advantages of dielectric isolation.

The heterojunction between the high band gap material and the low band gap semiconductor provides a barrier to current flow whose height depends on the band-gap difference, the electron-affinity difference and the doping type of the two materials and which provides isolation between the respective devices on an integrated circuit.

In a preferred embodiment, the integrated circuit includes one or more semiconductor wells which are each surrounded on their sides by an insulator material such as silicon dioxide. The insulator material effectively insulates the adjacent semiconductor wells from each other.

The bottoms of the semiconductor wells are disposed atop a high band-gap material which provides high thermal conductivity that allows heat to dissipate. Electrical isolation is provided by the heterojunction between the high band-gap and low band-gap semiconductor materials.

A semiconductor substrate may be provided to support the high band-gap material. Also, a layer of insulation material may be provided between the high band-gap material and the semiconductor substrate. Polycrystalline silicon or a low carrier lifetime semiconductor material may be used instead of the high band-gap material. Also, vertical power devices may be integrated with lateral high voltage power devices, CMOS devices and other analog circuit elements in the integrated circuit of the present invention.

Other features and advantages of the present invention will become apparent from the following description of the invention which refers to the accompanying drawings.

DETAILED DESCRIPTION OF THE INVENTION

The present invention provides an integrated circuit device in which a relatively low band gap material that is used as a device layer is disposed atop a high (wide) band gap material that is used as a thermally conducting, electrically insulating layer.

Figure 1:
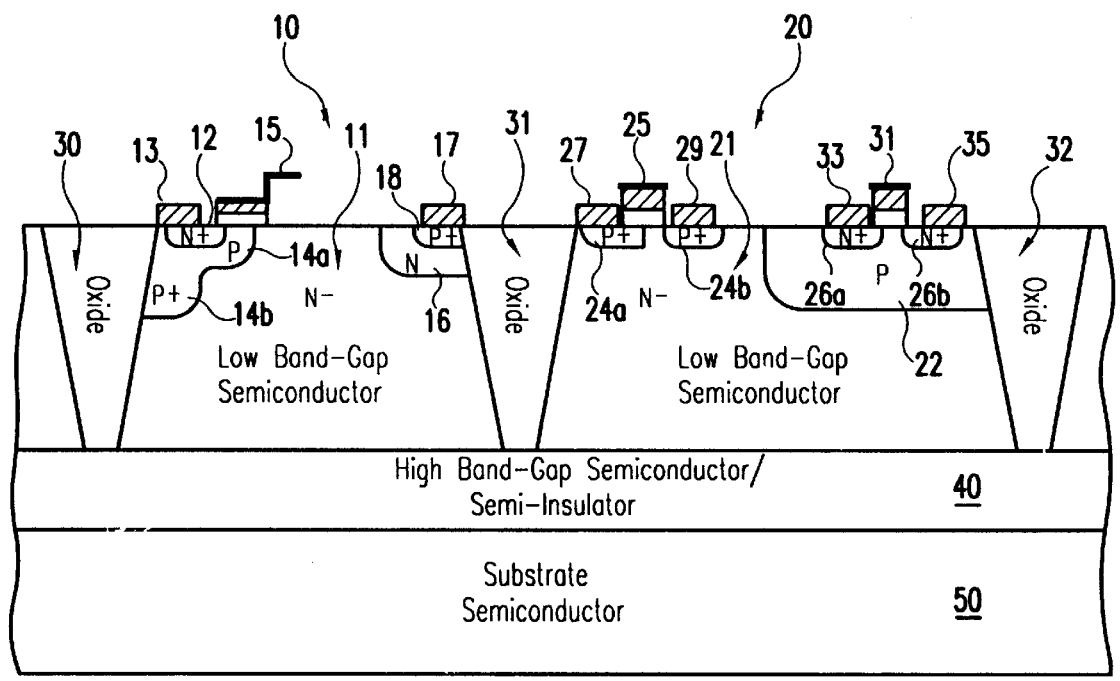
FIG. 1 is a cross-sectional view showing the structure of an integrated circuit according to an embodiment of the invention.

FIG. 1 shows the structure of an integrated circuit comprised of at least a lateral IGBT 10 and a lateral CMOS device 20 which are formed in wells 11 and 21, respectively, and which are isolated by oxide or other insulating material regions 30, 31 and 32. The oxide regions 30, 31, 32, which may be silicon dioxide or germanium oxide, effectively insulate the adjacent semiconductor wells 11 and 21 from each other. Each of the wells 11 and 21 is comprised of a low band-gap material, such as silicon or germanium.

The lateral IGBT 10 formed in well 11 is comprised of an N+ source region 12 which is formed in a P-type body region comprised of heavily doped P+ lower region 14b and more lightly doped P channel region 14a which are, in turn, formed in-well 11. Also formed in the well 11 is an N-type drift region 16 in which a P+ anode 18 is formed therein. An insulated gate electrode 15 is disposed atop the P channel region 14a. Also disposed on the top surface are source contact 13 and anode contact 17.

The CMOS device includes a p-channel device formed of source and drain regions 24a and 24b. An insulated gate electrode 25 is disposed atop the channel region between the source and drain regions. Also present are source and drain contact electrodes 27 and 29 which are disposed atop the respective source and drain regions. An N channel MOSFET is formed in a P-tub 22 which is formed in the N-type well 21 and is formed of N+ source regions 26a and 26b. An insulated gate electrode 31 is disposed atop the channel region between the source and drain regions. Source and drain contact electrodes 33 and 35 contact the respective source and drain regions.

It should also be noted that other MOS gate controlled semiconductor devices or bipolar devices may be formed in respective wells in the low band gap semiconductor material.

The devices 10, 20 are disposed atop a high band gap semi-insulator layer 40 which may be supported by an optional substrate 50 such as silicon. The semi-insulating material 40 may be comprised of silicon carbide, gallium nitride, semi-insulating polysilicon, amorphous silicon, low-carrier-lifetime silicon, beryllium oxide, aluminum oxide or other semi-insulating materials. Such materials provide high thermal conductivity but low electrical conductivity. Thus, heat dissipation in the integrated circuit may be obtained through the isolation material 40, in addition to having the advantages of dielectric isolation between the devices 10, 20.

The heterojunction between the high band gap material 40 and the low band-gap semiconductor wells 11, 21 provides a barrier for preventing current flow between the adjacent devices 10, 20 on the integrated circuit. The amount of isolation provided by the insulator 40 depends on the band-gap difference, the electron-affinity difference, the carrier lifetime, and the type of doping used in the low band-gap and high band-gap materials.

Figure 2:
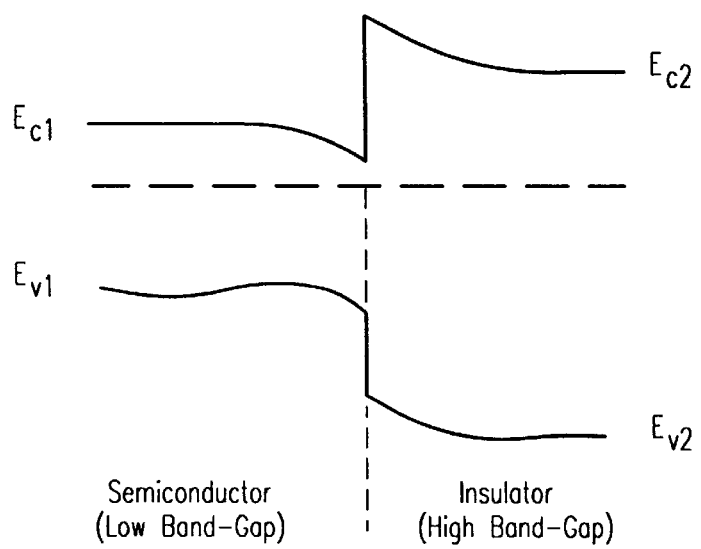
FIG. 2 is a band diagram showing the heterojunction between the low band-gap semiconductor material and high band-gap insulator material of the embodiment of FIG. 1.

FIG. 2 shows the gap between the energy states of the valance and conduction bands of a low band gap semiconductor material, such as silicon or germanium, and the gap between the energy states of the valance and conduction bands of higher band gap materials. FIG. 2 graphically depicts the benefits of providing these higher band gap materials, such as silicon carbide, gallium nitride, beryllium oxide or aluminum oxide, in a structure in which a plurality of lateral devices are formed in low band-gap semiconductor materials. Specifically, the parasitic current flow between the adjacent devices is reduced or eliminated while heat dissipation through the insulating material is increased.

Figure 3:
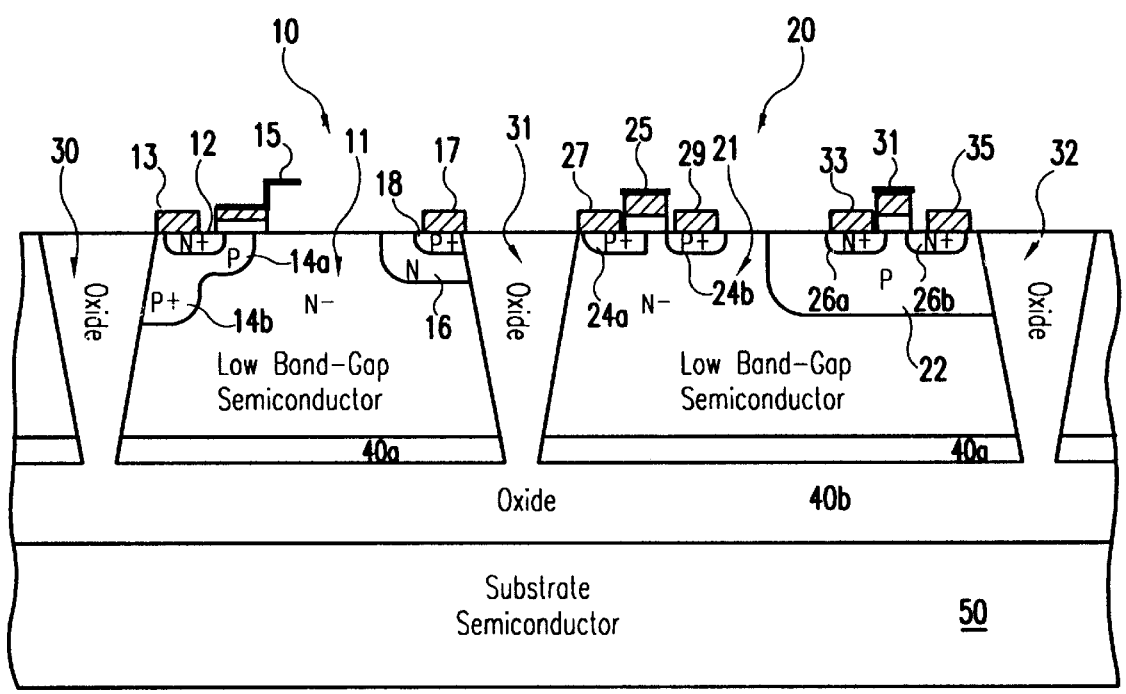
FIG. 3 is a cross-sectional view showing the structure of an integrated circuit according to another embodiment of the invention.

FIG. 3 shows the structure of an alternative embodiment of the invention in an integrated circuit wherein a combination of high-band-gap layer/semi-insulator layer (40a) and oxide layer (40b) is used to isolate the respective devices in the IC. The high-band-gap/semi-insulator layer 40a shields the semiconductor device region from the influence of potential in the substrate region and provides thermal conductivity. Thus the oxide layer 40b can be made thin even for high-voltage devices thereby reducing wafer-warpage.

Figure 4:
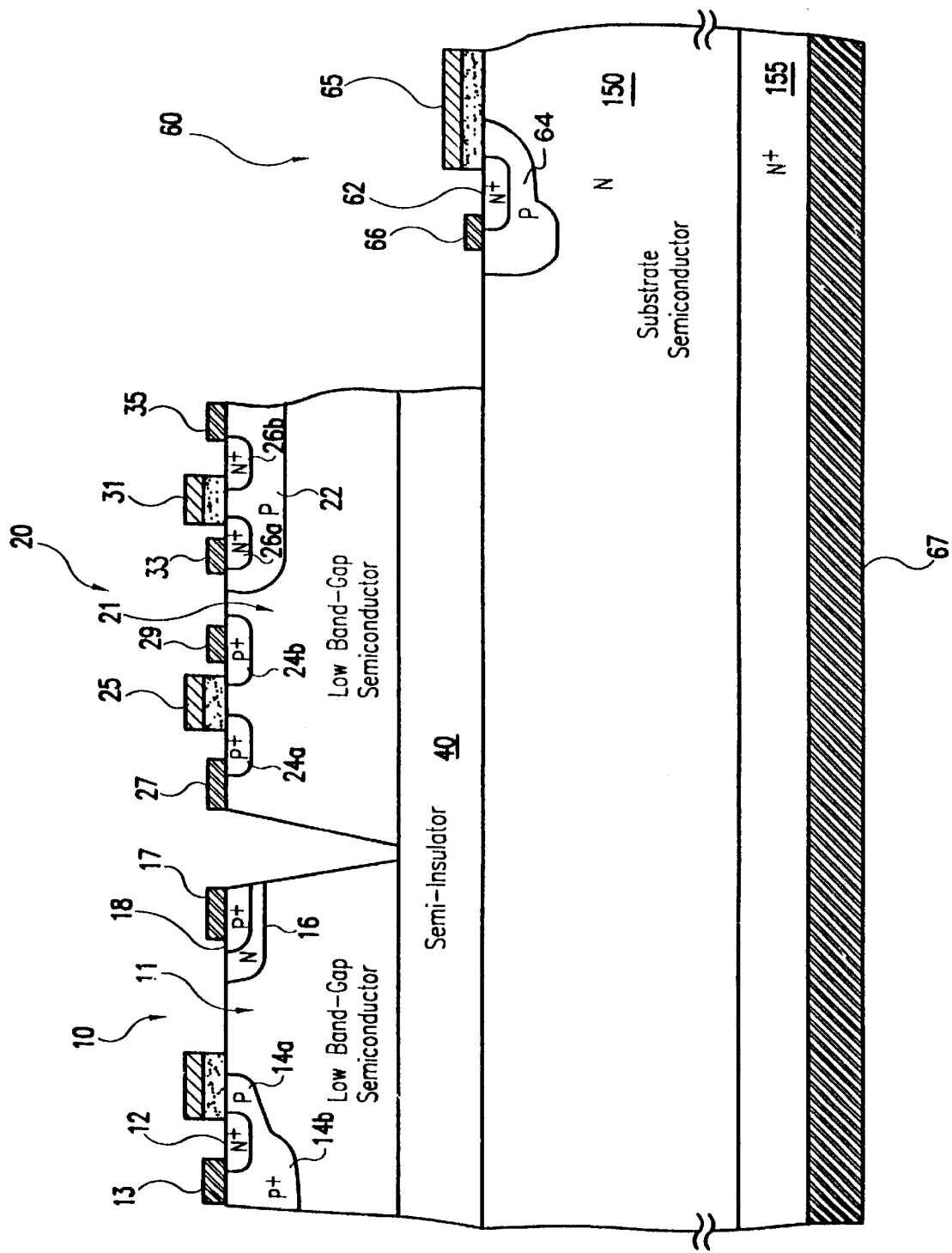
FIG. 4 is a cross-sectional view showing the structure of an integrated circuit according to another embodiment of the invention which integrates a vertical power device with lateral devices.

FIG. 4 shows the structure of an alternative embodiment of the invention in which a vertical power MOSFET is integrated together with the lateral devices of FIG. 1. A vertical power MOSFET 60 is formed in an N-type semiconductor substrate 150 and includes an N+ source region 62 formed in a P-type body region 64. An insulated gate electrode 65 is disposed atop part of the P-type body region 64 and atop part of the source region 62. Also, disposed on part of the source region 62 is a source metal electrode 66, and disposed on the bottom surface of the semiconductor substrate 150 is a drain metal electrode 67. An N+ type layer 155 may be included between the semiconductor substrate 150 and the drain metal 67.

Alternatively, a vertical power MOSFET device may be formed in the high band-gap semiconductor layer 40.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An integrated circuit device comprising:
   a semiconductor substrate comprising a single layer of semiconductor material;
   an insulating layer disposed directly on said semiconductor substrate;
   a thermally conducting, semi-insulating layer composed of a material selected from the group consisting of silicon carbide, gallium nitride, amorphous silicon, beryllium oxide, aluminum oxide and low-carrier-lifetime silicon disposed directly on said insulating layer; and
   a low band gap semiconductor device layer disposed directly on said semi-insulating layer;
   said semi-insulating layer being comprised of a material having a larger band gap than that of said semiconductor device layer.

2. The integrated circuit device of claim 1 which said device layer is comprised of silicon.

3. The integrated circuit device of claim 1 wherein said device layer is comprised of germanium.

4. The integrated circuit device of claim 1 wherein said semi-insulating layer is comprised of silicon carbide.

5. The integrated circuit device of claim 1 wherein said semi-insulating layer is comprised of gallium nitride.

6. The integrated circuit device of claim 1 wherein said semi-insulating layer is comprised of beryllium oxide.

7. The integrated circuit device of claim 1 wherein said semi-insulating layer is comprised of aluminum oxide.

8. The integrated circuit device of claim 1 wherein at least two semiconductor devices are formed in said device layer, said semiconductor devices being isolated from each other by a region of insulating material extending from a top surface of said device layer to said semi-insulating layer.

9. The integrated circuit device of claim 8 wherein said region of insulating material is comprised of silicon dioxide.

10. The integrated circuit device of claim 8 wherein said region of insulating material is germanium dioxide.

11. The integrated circuit device of claim 8 wherein said device layer is comprised of a doped region of one conductivity type, and at least one of said semiconductor devices comprises: at least one body region of another conductivity type, which is of opposite conductivity type to said one conductivity type, formed in a top surface of said device layer; at least one source region of said one conductivity type formed in a portion of said body region at said top surface and forming a channel region in said top surface between said source region and said device layer; a gate electrode disposed on said top surface and overlaying and being insulated from said channel region and being operable to invert said channel region in response to a suitable gate voltage supplied thereto; a source electrode disposed at least on said source region; and a further electrode disposed on a portion of said top surface of said device layer.

12. The integrated circuit device of claim 11 wherein said semiconductor device further comprises an anode region of said another conductivity type formed in said top surface of said device layer and being laterally spaced from said body region; and wherein said further electrode is disposed on said anode region and comprises an anode electrode.

13. The integrated circuit device of claim 8 wherein said device layer includes a region of one conductivity type, and wherein at least one of said semiconductor devices comprises: at least one source region and at least one drain region of another conductivity type, which is of opposite conductivity type to said one conductivity type, formed in said region of one conductivity type and forming a channel region between said source region and said drain region; a gate electrode disposed on said top surface and overlaying and being insulated from a channel region formed between said source and said drain region and being operable to invert said channel region in response to a suitable gate voltage supplied thereto; a source electrode disposed at least on said source region; and a drain electrode disposed at least on said drain region.

14. The integrated circuit device of claim 13 wherein said at least one semiconductor device further comprises a tub region of said another conductivity type formed in said top surface of said region of one conductivity type and being laterally spaced from said source and drain regions; at least one further source region and at least one further drain region formed in said top surface of said device layer in said tub region and forming a further channel region therebetween; a further gate electrode disposed on said top surface and overlaying and being insulated from said further channel region and being operable to invert said further channel region in response to a suitable gate voltage supplied thereto; a further source electrode disposed at least on said further source region; and a further drain electrode disposed at least on said further drain region.

15. An integrated circuit device comprising:

a semiconductor substrate comprising a single layer of semiconductor material;

an insulating layer disposed directly on said semiconductor substrate;

a plurality of wells of a low band gap material formed in said insulating layer, a semiconductor device being formed in each well; and a thermally conducting, semi-insulating layer composed of a material selected from the group consisting of silicon carbide, gallium nitride, amorphous silicon, beryllium oxide, aluminum oxide and low-carrier-lifetime silicon disposed on a bottom of each of said wells and directly contacting said insulating layer;

said semi-insulating layer being comprised of a material having a larger band gap than that of said semiconductor device layer.

16. An integrated circuit device comprising:

a semiconductor substrate comprising a single layer of semiconductor material;

an insulating layer disposed directly on said semiconductor substrate;

a thermally conducting, semi-insulating layer composed of a material excluding semi-insulating polysilicon disposed directly on said insulating layer; and a low band gap semiconductor device layer disposed directly on said semi-insulating layer;

said semi-insulating layer being comprised of a material having a larger band gap than that of said semiconductor device layer.

* * * * *